(12) United States Patent
Yao et al.

(10) Patent No.: US 8,405,297 B2
(45) Date of Patent: Mar. 26, 2013

(54) ILLUMINATION DEVICE WITH WIDE OUTPUT ANGLE AND MANUFACTURE METHOD THEREOF

(75) Inventors: Yuan-Jung Yao, Hsin-Chu (TW); Ruei-Teng Lin, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/955,143

(22) Filed: Nov. 29, 2010

(65) Prior Publication Data
US 2011/0127903 A1 Jun. 2, 2011

(30) Foreign Application Priority Data
Dec. 1, 2009 (TW) ................................ 98141038 A

(51) Int. Cl.
*H01J 5/00* (2006.01)
*H01J 9/00* (2006.01)
(52) U.S. Cl. ........... 313/498; 313/113; 313/317; 29/841
(58) Field of Classification Search .......... 313/498–512, 313/113, 137; 362/362; 257/99, 100
See application file for complete search history.

(56) References Cited

U.S. PATENT DOCUMENTS

| 7,348,723 | B2 | 3/2008 | Yamaguchi et al. |
| 7,909,486 | B2 | 3/2011 | Kim |
| 2006/0083000 | A1 | 4/2006 | Yoon et al. |
| 2006/0138437 | A1* | 6/2006 | Huang et al. ..................... 257/98 |
| 2008/0303757 | A1 | 12/2008 | Ohkawa et al. |
| 2010/0073937 | A1* | 3/2010 | Ho ................................. 362/335 |

FOREIGN PATENT DOCUMENTS

| CN | 101440928 A | 5/2009 |
| CN | 101452987 A | 6/2009 |
| CN | 101556023 A | 10/2009 |
| KR | 10-0902908 B1 | 6/2009 |
| TW | I261654 | 9/2006 |

OTHER PUBLICATIONS

English translation of abstract of CN 101452987 A.
English translation of abstract of CN 101440928 A.
China Office Action dated Jan. 10, 2011.
China Office Action dated Apr. 19, 2012.
English translation of abstract and pertinent parts of CN 101556023 A.
English translation of abstract of TW I261654.
China Office Action dated Sep. 15, 2011.

* cited by examiner

*Primary Examiner* — Tracie Y Green
(74) *Attorney, Agent, or Firm* — McClure, Qualey & Rodack, LLP

(57) ABSTRACT

An illumination device and a manufacture method thereof are provided. The illumination device includes a base, an illumination chip, and a sealant. The illumination chip is disposed on the base while the sealant covers the illumination chip. The sealant has an outer surface which includes an inner circular convex and an outer circular convex surrounding the inner circular convex. The inner circular convex encloses a space with a narrow bottom and a wide opening. The illumination chip is disposed within a projective area of the inner circular convex. A part of the light emitted from the illumination chip is directly reflected from the inner circular convex to the outer circular convex and directly leaves the sealant from the outer circular convex.

24 Claims, 8 Drawing Sheets

ILLUMINATION DEVICE WITH WIDE OUTPUT ANGLE AND MANUFACTURE METHOD THEREOF

BACKGROUND OF THE INVENTION

1. Field of the Invention

The present invention generally relates to an illumination device and a manufacture method thereof. Particularly, the present invention relates to an illumination device and a manufacture method thereof to prevent the formation of overly concentrated light.

2. Description of the Prior Art

Display panels and display devices using the display panels gradually become a mainstream among a variety of display devices. For example, home flat-panel TVs, panel monitors of personal computer and laptop computer, and display screens of mobile phone and digital camera are products which use a great deal of display panels. Particularly, the market demand for the liquid crystal display device rises rapidly in recent years. The design of backlight module for liquid crystal display device becomes diverse in order to fulfill the requirement of function and appearance.

For the pursuit of lighter weight, smaller dimension, and less power consumption, light-emitting diode (LED) devices have been largely used as the light source. Either edge-lighting or bottom-light backlight module can use LEDs as the light source. FIG. 1 shows a conventional LED element. As FIG. 1 shows, the conventional LED device includes a base 10, on which a light-emitting diode (LED) chip 20 is disposed. On the base 10 a sealant 30 is provided to cover the LED chip 20. The surface of the sealant 30 is usually formed as a convex surface.

Due to the geometric properties of convex surface, light is easily centralized in a forward direction of the LED device. When such a design is combined with the backlight module, the characterization of light centralizing results in local spot phenomenon that affects the image quality of the display device. In order to overcome the problem, it is usually to increase the light mixing distance in the backlight module and the overall thickness is accordingly increased. Another way to overcome the problem is increasing the quantity of diffuser plate in the backlight module that adversely increases the overall thickness and the cost.

SUMMARY OF THE INVENTION

It is an object of the present invention to provide an illumination device and a manufacture method thereof to prevent light from overly centralizing.

It is another object of the present invention to provide an illumination device and a manufacture method thereof to increase the light output angle with respect to the central line.

The illumination device includes a base, an illumination chip, and a sealant. The illumination chip is disposed on the base; the sealant is provided on the base to cover the illumination chip. Except for the surface connecting with the base, the part of the sealant exposed to the air serves as an outer surface. The outer surface mainly includes two parts: an inner circular convex and an outer circular convex. The outer circular convex surrounds the inner circular convex as a circular shape. The inner circular convex is formed as a trumpet with a cambered surface, which encloses a cone space having a narrow bottom and a wide opening. The outer rim of the inner circular convex is connected to and enclosed by the inner rim of the outer circular convex.

The illumination chip is preferably located within a projection area of the inner circular convex on the base, therefore the light emitted from the illumination chip can largely impinge onto the inner circular convex. A part of the light emitted from the illumination chip will be refracted by the inner circular convex and leaves the sealant directly. Another part of the light emitted from the illumination chip is reflected directly by the inner circular convex to the outer circular convex and then refracted by the outer circular convex out of or leave directly the sealant. The inner circular convex and the outer circular convex together prevent the light emitted from the illumination chip from centralizedly leaving from the center of the sealant to effectively distribute the light and enlarge the output angle of light.

A manufacture method of the illumination device of the present invention includes the following steps: forming a base; disposing an illumination chip on the base; forming a sealant on the base; and forming an inner circular convex and an outer circular convex on the outer surface of the sealant which connects to the base in a manner that the inner circular convex reflects a part of the light generated from the illumination chip to the outer circular convex and directly leave the sealant from the outer circular convex.

DETAILED DESCRIPTION OF THE PREFERRED EMBODIMENT

The present invention provides an illumination device and a manufacture method thereof. In a preferred embodiment, the illumination device is an illumination device consisting of light-emitting diode (LED); in other embodiments, however, the diode chip of the light-emitting diode (LED) can be replaced with other illumination mechanism. The illumination device is preferably provided for use in a backlight module, especially a bottom lighting backlight module. In a preferred embodiment, the backlight module is provided for use in the liquid crystal display (LCD) device. In other embodiments, however, the backlight module can be used in PC keyboard, mobile phone keys, billboard, and other devices which need a plane light source. Furthermore, the present invention includes a liquid crystal display (LCD) device using the illumination device or the backlight module. In a preferred embodiment, the liquid crystal display device of the present invention includes a color liquid crystal display device. In another embodiment, however, the liquid crystal display device of the present invention can include a mono liquid crystal display device. Moreover, the liquid crystal device broadly refers to any display device using the liquid crystal panel, which includes a home LCD TV, LCD monitors for PC and laptop computer, and liquid crystal display panels of mobile phone and digital camera.

Figure 1:
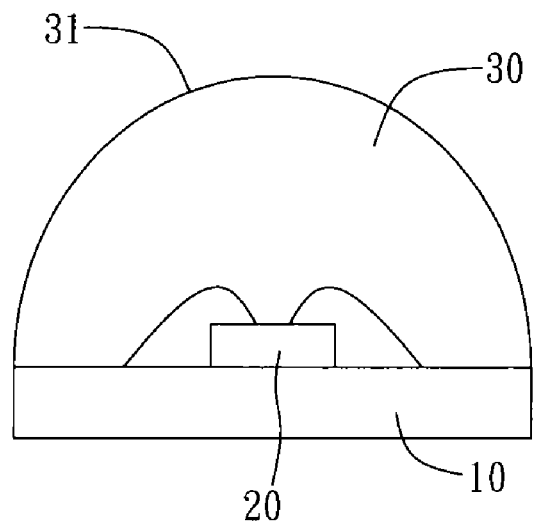
FIG. 1 is a schematic view of a LED device used in a conventional bottom-lighting backlight module.
Figure 2:
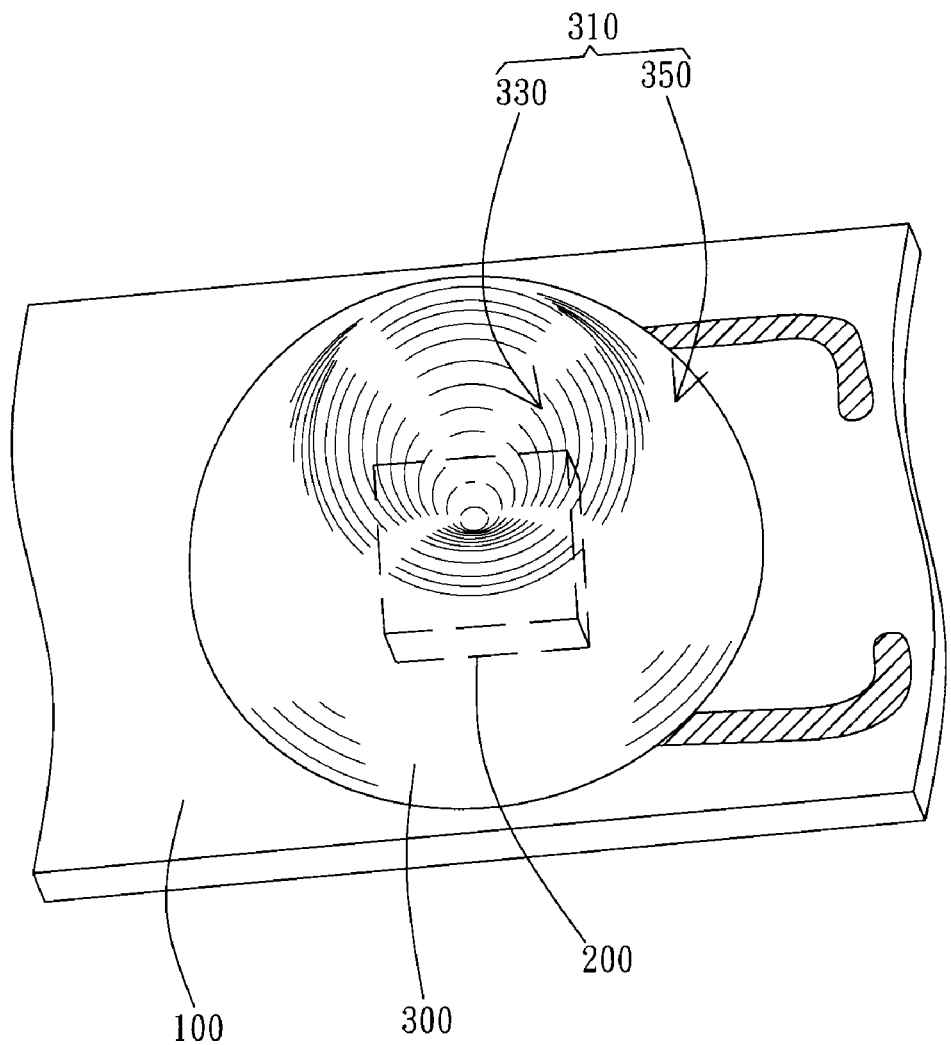
FIG. 2 is a perspective view of the embodiment of the illumination device of the present invention.

As FIG. 2 shows, the illumination device includes a base 100, an illumination chip 200, and a sealant 300. The base 100 is preferably a printed circuit board or other circuit-bearing substrate on which bonding pads or bumps are disposed to electrically connect with the illumination chip 200. In other embodiment, however, the base 100 can also be formed in a cup shape and encloses a containing space for accommodating the illumination chip 200. In a preferred embodiment, the illumination chip 200 includes a LED chip consisting of at least one diode die; in other embodiment, however, the light-emitting diode (LED) chip may be replaced with other illumination mechanism to serve as the illumination chip 200. The illumination chip 200 preferably lies on the base 100 with an illumination top surface 210 which emits light toward a direction opposite to the base 100. The illumination top surface 210 is preferably a rectangular plane; however, the illumination top surface 210 can be different shapes of plane or a curved surface according to the shape of the illumination chip 200.

In the embodiment shown in FIG. 2, the sealant 300 is provided on the base 300 and covers the illumination chip 200. The sealant 300 can be solid sealant or liquid sealant. The material of the sealant 300 can be epoxy resin, silicone resin or other polymer material. Furthermore, the sealant 300 can be added with suitable mixtures, such as phosphor powders, to meet the requirement of color and brightness. As FIG. 2 shows, after disposing the sealant 300 on the base 100, a structure of hemisphere-like or disk-like shape is formed. In other embodiment, however, the sealant 300 can be formed in a half-ellipsoid or an oval plate-like shape.

Figure 3:
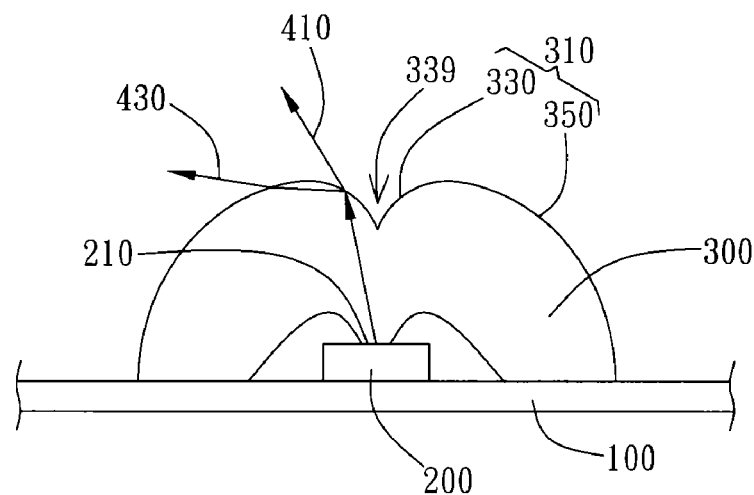
FIG. 3 is a cross-sectional view of the embodiment of the illumination device.

Except for the face of the sealant 300 connecting with the base 100, the part of the sealant 300 exposed to the air forms an outer surface 310. As FIG. 2 and FIG. 3 show, the edge of the outer surface 310 connects to the surface of the base 100. The outer surface 310 mainly includes two parts: an inner circular convex 330 and an outer circular convex 350. The convex used herein indicates that the outer surface 310 protrudes outward with respect to the inner side of the sealant 300 to form a cambered surface. The outer circular convex 350 surrounds the inner circular convex 330 as a circular shape. With respect to the inner side of the sealant 300, the outer surface 310 protrudes outward and is preferably a part of spherical surface with no singular point (except for the edge position). In a preferred embodiment, the outer circular convex 350 is formed as a part of a convex spherical surface. The spherical surface herein can include a part of a circular spherical surface, an elliptic spherical surface, or a spherical surface in other forms. In the embodiment shown in FIG. 3, the outer circular convex 350 directly connects to the base 100 and is perpendicular to the base 100 where the outer circular convex 350 and the base 100 are connected. Besides, in this embodiment, the arc of the outer circular convex 350 on a radial cross section is a quarter of the circumference of a circle.

As FIG. 2 and FIG. 3A show, the inner circular convex 330 is formed as a trumpet with a cambered surface and encloses a first space 339 in a cone shape having a narrow bottom and a wide opening, wherein the inner circular convex 330 protrudes toward the first space 339. The outer rim of the inner circular convex 330 is connected to and enclosed by the inner rim of the outer circular convex 350. Because the inner circular convex 330 and the outer circular convex 350 are both outward convexes, the joint of the inner circular convex 330 and the outer circular convex 350 can be selectively formed continuously or discontinuously. As the embodiments shown in FIG. 2 and FIG. 3, the joint is continuous without forming a tip or a ridge. In other embodiment, however, the joint of the inner circular convex 330 and the outer circular convex 350 can be discontinuous, and then a ridge will be formed at the joint. Besides, in a further embodiment, there can be other surfaces, such as a plane, a convex, or a concave, disposed between the inner circular convex 330 and the outer circular convex 350 to provide different optical effects.

As FIG. 3 shows, the illumination chip 200 is preferably located within a projection area of the inner circular convex 330 on the base 100, therefore the light emitted from the illumination chip 200 can largely impinge onto the inner circular convex 330. A part of the light 410 emitted from the illumination chip 200 will be refracted by the inner circular convex 330 and leaves the sealant 300 directly. Another part of the light emitted from the illumination chip 200 is reflected directly by the inner circular convex 330 to the outer circular convex 350 and then refracted by the outer circular convex 350 to leave or leave directly the sealant 300. The inner circular convex 330 and the outer circular convex 350 together prevent the light emitted from the illumination chip 200 from centralizing in the center of the sealant 300 and leaving from the center of the sealant 300 so as to effectively distribute the light and enlarge the output angle of light.

Figure 4:
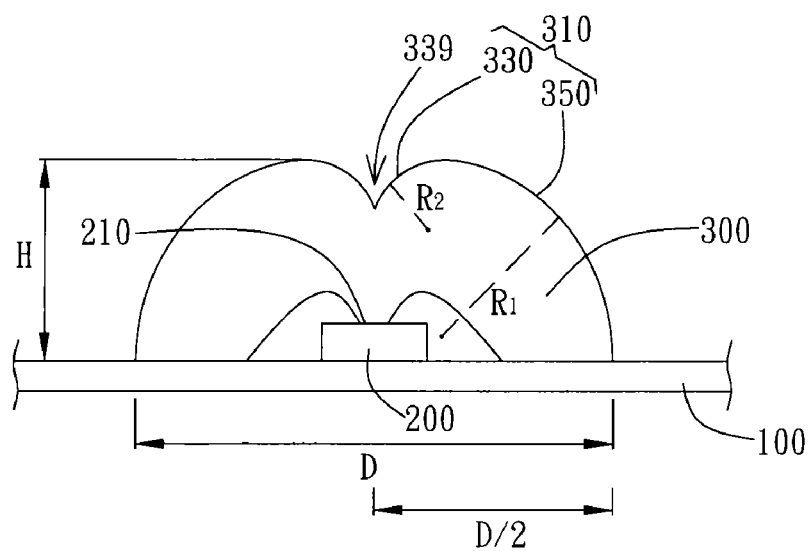
FIG. 4 shows a light path of the illumination device.

As FIG. 4 show, the outer circular convex 350 and the inner circular convex 330 have a first radius of curvature R1 and a second radius of curvature on the same radial cross section, respectively. The radial cross section preferably has a radial center coinciding with the center of the illumination chip 200; in other embodiment, however, the radial cross section can have a radial center at any point along the edge of the illumination chip 200. In the embodiment, the radius of curvature of the outer circular convex 350 and the radius of curvature of the inner circular convex are constant. Therefore, the first radius of curvature R1 and the second radius of curvature R2 are respectively the radius of curvature of every point on the outer circular convex and that on the inner circular convex. In other embodiment, however, the radius of curvature of the outer circular convex 350 and the radius of curvature of the inner circular convex 330 are not constant. Thus, the first radius of curvature R1 and the second radius of curvature R2 are respectively an average radius of curvature of the points on the outer circular convex and that on the inner circular convex. In a preferred embodiment, the sum of the first radius of curvature $R_1$ and the second radius of curvature $R_2$ is between a radius D/2 and a diameter D of the same radial cross section of the sealant 300, and the first radius of curvature $R_1$ is different from the second radius of curvature $R_2$. The difference thereby results in an asymmetry of the outer circular and the inner circular. In this regard, when the first radius of curvature $R_1$ increases, the second radius of curvature $R_2$ preferably decreases. Besides, in a preferred embodiment, the first radius of curvature $R_1$ greater than the second radius of curvature $R_2$ brings a convenience in design and in application.

As FIG. 4 shows, the sealant 300 has a largest height H on the same radial cross section. In this embodiment, the arc of the outer circular convex 350 on the radial cross section is a quarter of the circumference of a circle, and the inner circular convex 330 and the outer circular convex 350 are connected continuously. Therefore, the largest height is from the boundary of the outer circular convex 350 and the inner circular convex 330 to the base 100. In a preferred embodiment, the ratio of the first radius of curvature $R_1$ to the largest height H, $R_1/H$, is between 0.6 and 1. With such a ratio, the effect of reflecting the light directly to the outer circular convex 350 by the inner circular convex 330 can be improved.

Figure 5:
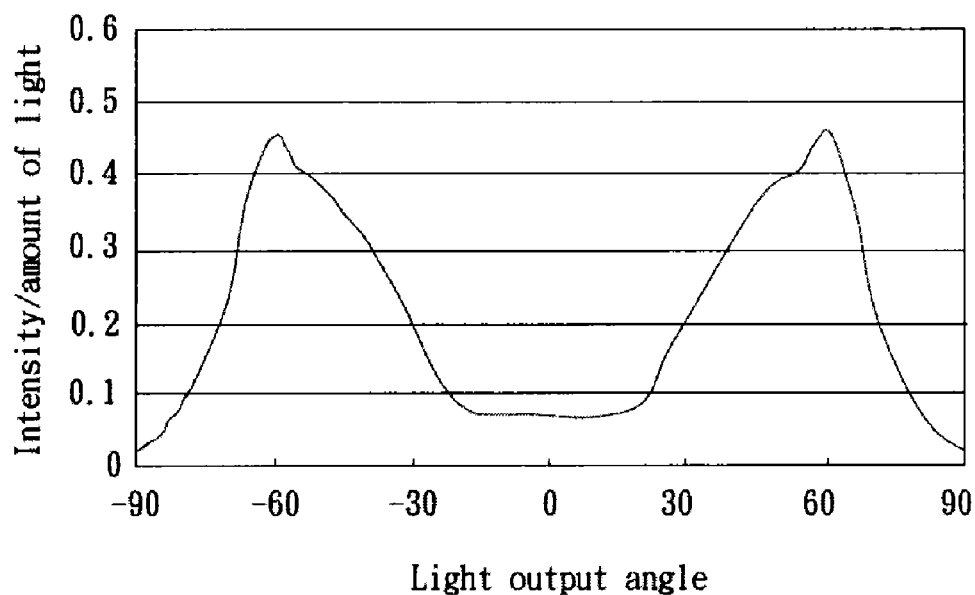
FIG. 5 is a diagram of the light distribution of the illumination device.

By such a design, the light output angle deviates with respect to the central line beyond 60 degrees. As FIG. 5 shows, when the first radius of curvature $R_1$ is 0.95 mm, the second radius of curvature $R_2$ is 1.15 mm, the largest height H is 1.25 mm, and the diameter D on the radial cross section is smaller than 5 mm, a distribution of light output angle can be shown in FIG. 5. As can be seen from FIG. 5, at the light output angle between 60 and 70 degrees, the intensity/amount of light is the largest.

Figure 6:
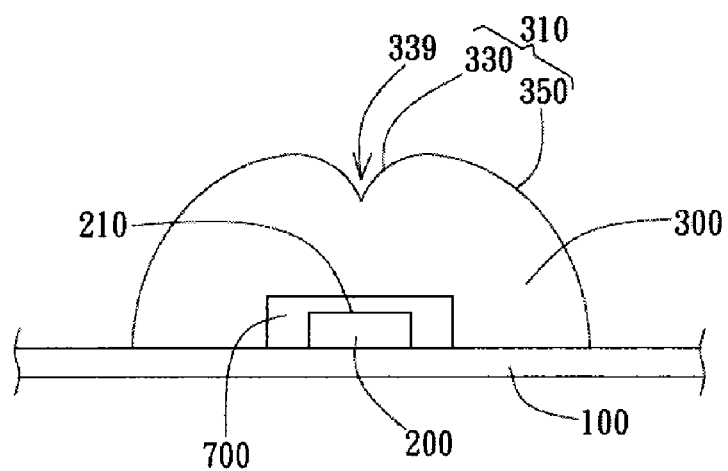
FIG. 6 is a schematic view of the phosphor powder layer contained in the illumination device.

As the embodiment shown in FIG. 6, the illumination device further includes a phosphor powder layer 700 covering the illumination chip 200, and the sealant 300 covers the phosphor powder layer 700. The thickness of the phosphor powder layer 700 is preferably smaller than 100 μm. The chromatic aberration caused by lights at different output angles can be controlled and reduced by a thinner phosphor powder layer 700 covering the illumination chip 200. The phosphor powder layer 700 is preferably made of yellow-green phosphor powders, such as YAG phosphor powders; in another embodiment, however, the phosphor powder layer 700 can be made of red-green powders.

Figure 7A:
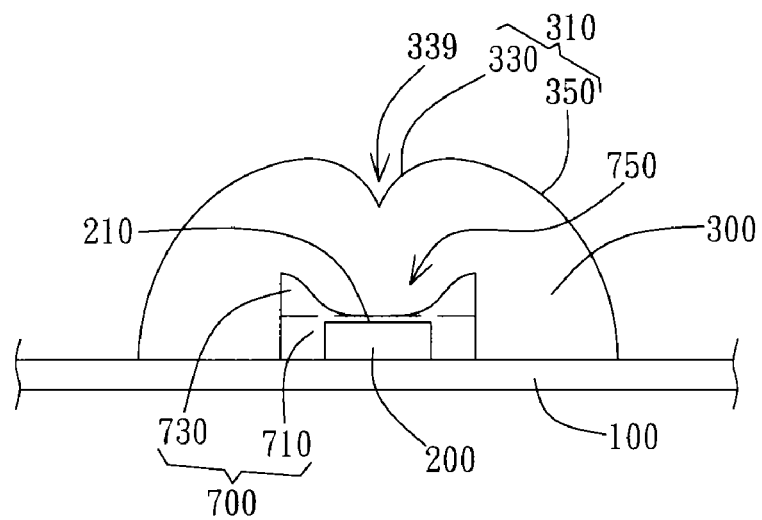
FIG. 7A-7D are schematic views of other embodiments of the phosphor powder layer.
Figure 7B:
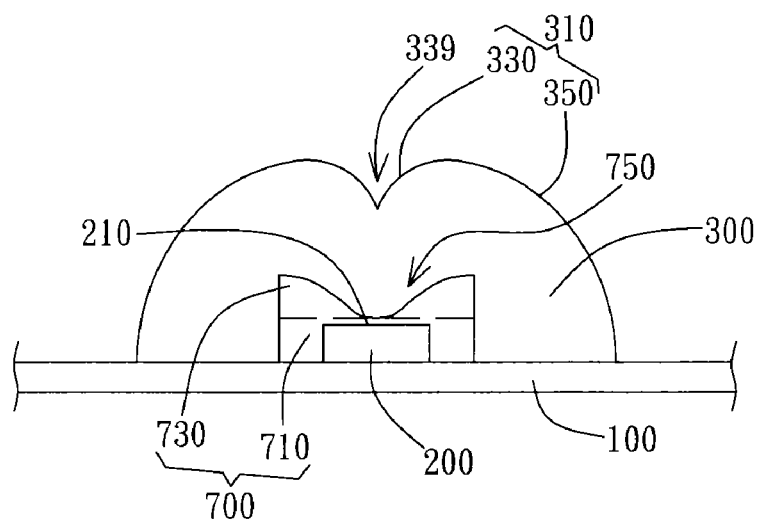

In the embodiment shown in FIG. 7A, the phosphor powder layer 700 can be formed in a cup shape having a cup bottom 710 and a cup wall 730. The cup-shaped phosphor powder layer 700 covers the illumination chip 200. That is, the illumination chip 200 is covered by the cup bottom 710 and the cup wall 730, such that the light from the illumination chip 200 has to pass through the cup bottom 710, or the cup bottom 710 and the partial cup wall 730 to emit out. The shape of the cup bottom 710 can selectively be a circle, a square, a rectangle, or other shapes. The cup wall 730 surrounds on the cup bottom 710 and together with the cup bottom 710 enclose a second space 750 where the sealant 200 is filled. In this embodiment, the part of the cup wall 730 closer to the center of the cup bottom 710 has a smaller thickness, that is to say, the outer surface of the cup wall 730 inclines toward the center of the cup bottom 710. Therefore, the second space 750 enclosed by the cup wall 730 and the outer surface of the cup bottom 710 is formed in a biscuit shape shrinking toward the center of the cup bottom 710. In other words, the rim of the phosphor powder layer 700 is thicker while the center of the phosphor powder layer 700 is thinner. In the embodiment shown in FIG. 7B, however, the cup wall 730 is thicker and the amplitude of inclination is more significant. Therefore, the second space 750 is formed in a cone shape tapering toward the center of the cup bottom 710. By collocating the shaped phosphor powder layer 700 described above with the inner circular convex 330 and the outer circular convex 350, the chromatic aberration caused by lights at different output angles can be effectively controlled and reduced.

Figure 7C:
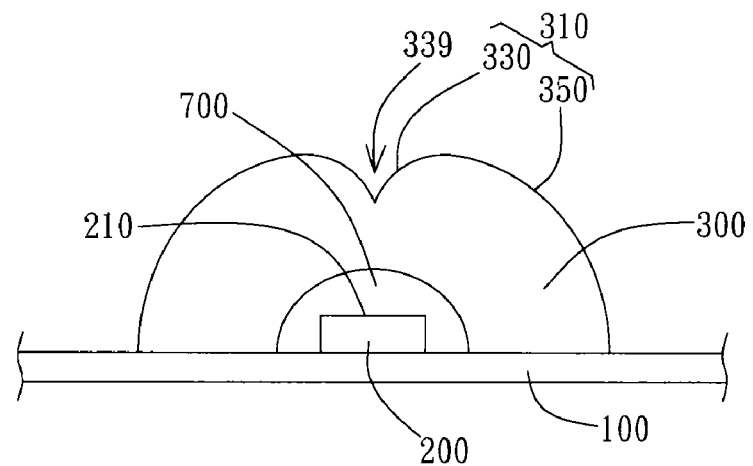
Figure 7D:
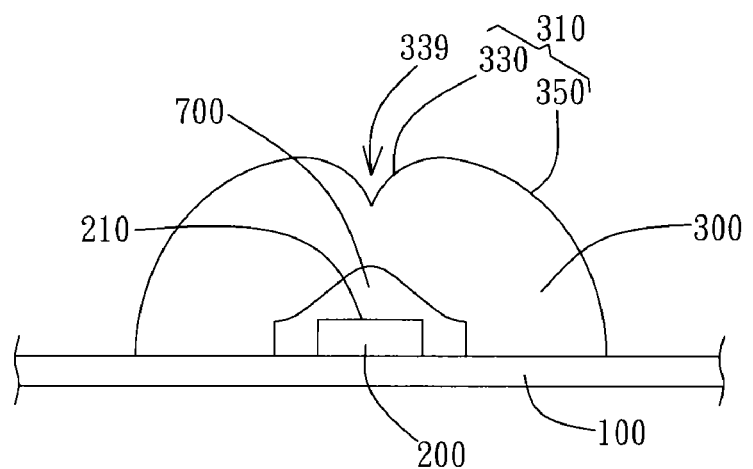

Besides, in the embodiment shown in FIG. 7C, the phosphor powder layer 700 can also be formed in a hemispherical shape protruding toward the sealant 300. In the embodiment shown in FIG. 7D, the phosphor powder layer 700 is formed in a cone shape protruding toward the first space 339 enclosed by the inner circular convex 330. In other words, the rim of the phosphor powder layer 700 is thinner while the center of phosphor powder layer 700 is thicker. By collocating the shaped phosphor powder layer 700 in these two embodiments with the inner circular convex 330 and the outer circular convex 350, the chromatic aberration caused by lights at different output angles can be effectively controlled and reduced.

Figure 8:
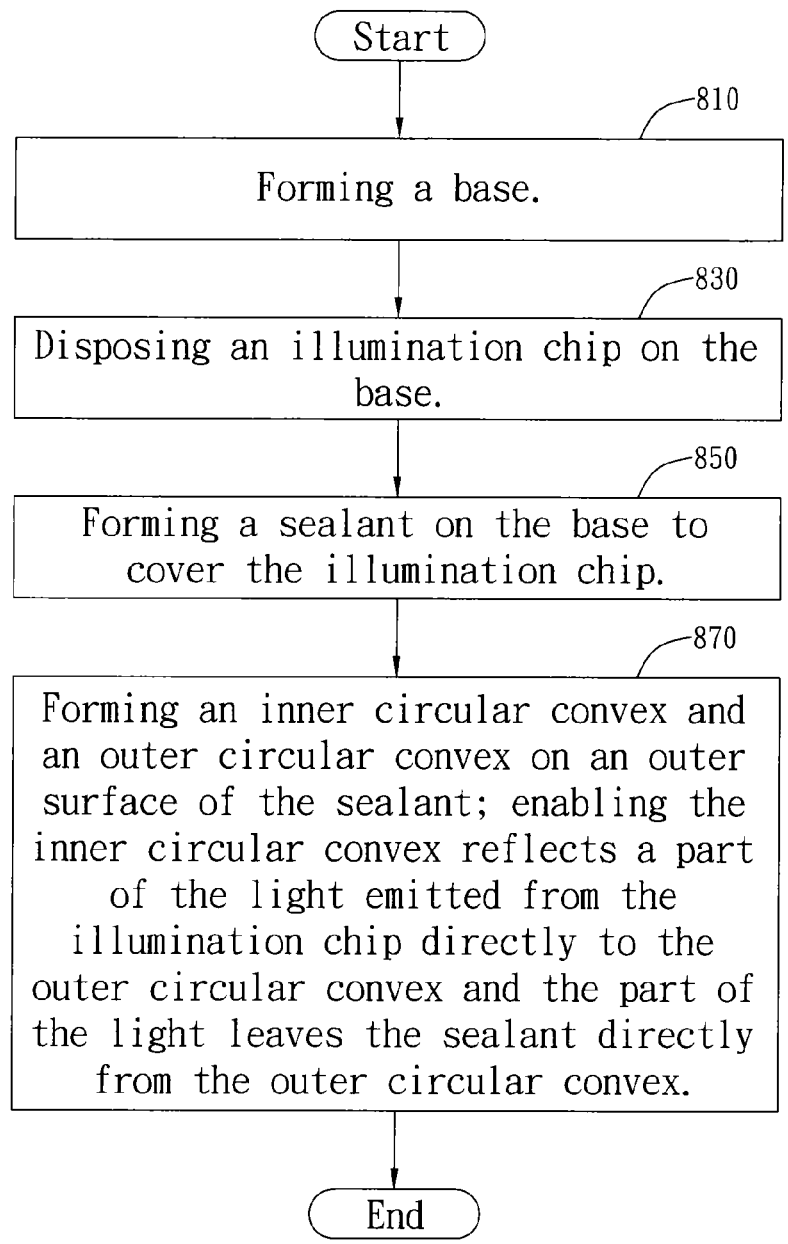
FIG. 8 is a flow chart of the embodiment of the manufacture method of the illumination device.

The present invention also includes a manufacture method of the illumination device. As the flow chart of the embodiment shown in FIG. 8, a step 810 includes: forming a base. In a preferred embodiment, the base is formed as a printed circuit board on which bumps or bonding pads are disposed to electrically connect with an illumination chip. A step 830 includes: disposing an illumination chip on the base. In a preferred embodiment, the illumination chip is made of light emitting diode die; in other embodiments, however, the illumination chip may be formed by other materials. The illumination chip is also disposed and connected to the bumps or bonding pads on the base for electrical connection.

A step 850 includes: forming a sealant covering the illumination chip on the base. In a preferred embodiment, the sealant is formed by injecting liquid material on the base and the illumination chip, and then curing the sealant by UV curing, thermosetting, or other curing methods. Besides, when injecting the sealing material, the volume of the sealant is preferably controlled to control the final dimension of the sealant.

A step 870 includes: forming an inner circular convex and an outer circular convex on an outer surface of the sealant connecting with the base, enabling the inner circular convex to directly reflect a part of the light emitted from the illumination chip to the outer circular convex and the directly leave the sealant from the outer circular convex. In a preferred embodiment, the sealant can be shaped by injecting the sealant material into a mold with a shape corresponding to the outer surface of the sealant to form a space having a narrow bottom and a wide opening in the outer surface of the sealant and to form the inner circular convex and the outer circular convex. Afterwards, a step of covering the mold and the sealant on the base and the illumination chip is performed and then the sealant is cured by UV curing, thermosetting, or other curing methods. However, in other embodiments, the inner circular convex of the outer surface of the sealant can be formed by polishing or other methods after curing.

In step 870, it is preferable to determine a first radius of curvature of the outer circular convex and a second radius of curvature of the inner circular convex on a same radial cross section. In a preferred embodiment, the first radius of curvature and the second radius of curvature are different in a manner that the outer circular convex and the inner circular convex are asymmetrical. For a better optical effect and a better light distribution, a sum of the first radius of curvature and the second radius of curvature should be restricted to be between a radius and a diameter of the radial cross section. In this regard, the values of the first radius of curvature and the second radius of curvature can be adjusted inversely; in other word, an increase of the first radius of curvature decreases the value of the second radius of curvature, and vice versa. Besides, in a preferred embodiment, the first radius of curvature $R_1$ greater than the second radius of curvature $R_2$ brings a convenience in design and application.

In a preferred embodiment, the ratio of the first radius of curvature to a largest height of the sealant on the radial cross section can be limited to be between 0.6 and 1. When the ratio is determined, the values of the first radius of curvature and the second radius of curvature can be adjusted inversely to improve the efficiency of reflecting the light directly to the outer circular convex 350 by the inner circular convex 330

Figure 9:
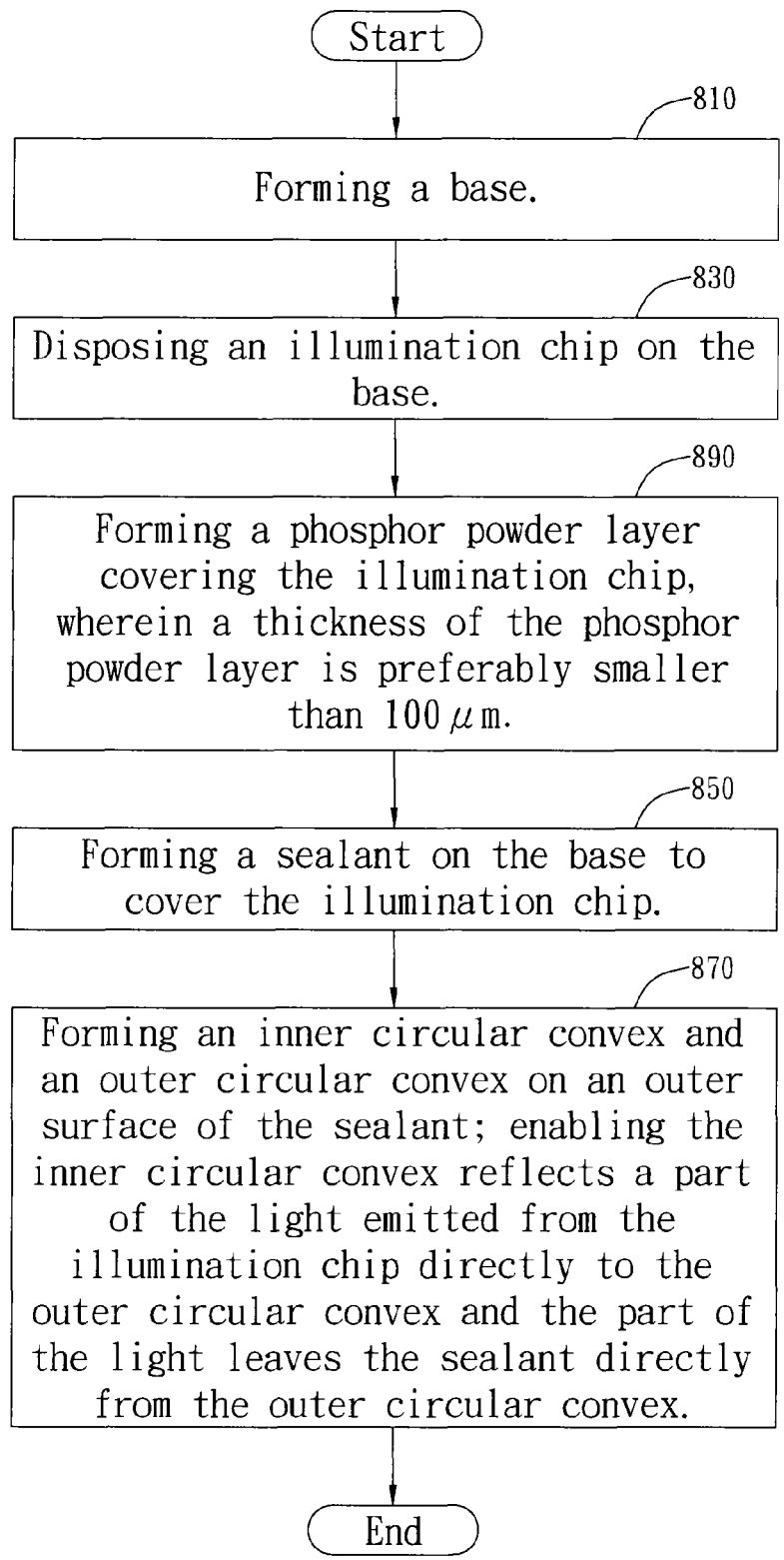
FIG. 9 is a flow chart of another embodiment of the manufacture method of the illumination device.

In the embodiment shown in FIG. 9, the manufacture method of the illumination device further includes a step 890: forming a phosphor powder layer covering the illumination chip and enabling the sealant to cover the phosphor powder layer, wherein the thickness of the phosphor powder layer is preferably smaller than 100 μm. The chromatic aberration caused by lights at different output angles can be controlled and reduced by a thinner phosphor powder layer 700 covering the illumination chip 200.

Although the preferred embodiments of present invention have been described herein, the above description is merely illustrative. The preferred embodiments disclosed will not limited the scope of the present invention. Further modification of the invention herein disclosed will occur to those skilled in the respective arts and all such modifications are deemed to be within the scope of the invention as defined by the appended claims.

What is claimed is:

1. An illumination device, comprising:
   a base;
   an illumination chip disposed on the base; and
   a sealant covering the illumination chip, the sealant having an outer surface including an inner circular convex and an outer circular convex surrounding the inner circular center convex, and having a radial cross section passing through the center of the sealant and perpendicular to the base; wherein the inner circular convex encloses a first space having a narrow bottom and a wide opening,
   wherein the illumination chip is located within a projection area of the inner circular convex on the base, a part of the light emitted from the illumination chip is reflected from the inner circular convex directly to the outer circular convex and leaves the sealant directly from the outer circular convex; the outer circular convex and the inner circular convex respectively have a first radius of curvature and a second radius of curvature on the same radial cross section of the sealant, wherein a sum of the first radius of curvature and the second radius of curvature is between a radius and a diameter of the radial cross section, the first radius of curvature is different from the second radius of curvature, and a ratio of the first radius of curvature to the largest height of the sealant on the radial cross section is between 0.6 and 1.

2. The illumination device of claim 1, wherein the largest height is from a boundary of the inner circular convex and the outer circular convex to the base.

3. The illumination device of claim 1, wherein the outer circular convex perpendicularly connects to the base.

4. The illumination device of claim 1, wherein the first radius of curvature is greater than the second radius of curvature.

5. The illumination device of claim 1, further comprising a phosphor powder layer covering the illumination chip, the sealant covering the phosphor powder layer; wherein a thickness of the phosphor powder layer is smaller than 100 µm.

6. The illumination device of claim 5, wherein the phosphor powder layer is formed in a cup shape having a cup bottom and a cup wall, the illumination chip is disposed within the cup bottom and the cup wall, and the cup wall surrounds on the cup bottom and together with the cup bottom enclose a second space, and the sealant is filled in the second space.

7. The illumination device of claim 6, wherein a part of the cup wall closer to a center of the cup bottom has a smaller thickness, and the second space is formed in a cone shape tapering toward the cup bottom.

8. The illumination device of claim 6, wherein a part of the cup wall closer to a center of the cup bottom has a smaller thickness, and the second space is formed in a biscuit shape shrinking toward the cup bottom.

9. The illumination device of claim 5, wherein the phosphor powder layer is formed in a hemispherical shape protruding toward the sealant.

10. The illumination device of claim 5, wherein the phosphor powder layer is formed in a cone shape protruding toward the first space enclosed by the inner circular convex.

11. An illumination device, comprising:
    a base;
    an illumination chip disposed on the base; and
    a sealant covering the illumination chip, the sealant having an outer surface including an inner circular convex and an outer circular convex surrounding the inner circular center convex, and having a radial cross section passing through the center of the sealant and perpendicular to the base, wherein the inner circular convex encloses a first space having a narrow bottom and a wide opening,
    wherein the illumination chip is located within a projection area of the inner circular convex on the base, the outer circular convex and the inner circular convex respectively have a first radius of curvature and a second radius of curvature on the same radial cross section of the sealant, wherein a sum of the first radius of curvature and the second radius of curvature is between a radius and a diameter of the radial cross section, the first radius of curvature is different from the second radius of curvature, and a ratio of the first radius of curvature to the largest height of the sealant on the radical cross section is between 0.6 and 1.

12. The illumination device of claim 11, wherein the largest height is from a boundary of the inner circular convex and the outer circular convex to the base.

13. The illumination device of claim 11, wherein the outer circular convex perpendicularly connects to the base.

14. The illumination device of claim 11, wherein the first radius of curvature is greater than the second radius of curvature.

15. The illumination device of claim 11, further comprising a phosphor powder layer covering the illumination chip, the sealant covering the phosphor powder layer, wherein a thickness of the phosphor powder layer is smaller than 100 µm.

16. The illumination device of claim 15, wherein the phosphor powder layer is formed as a cup having a cup bottom and a cup wall, the illumination chip is disposed within the cup bottom and the cup wall, the cup wall surrounds on the cup bottom and together with the cup bottom enclose a second space, and the sealant is filled in the second space.

17. The illumination device of claim 16, wherein a part of the cup wall closer to a center of the cup bottom has a smaller thickness, and the second space is formed in a cone shape tapering toward the cup bottom.

18. The illumination device of claim 16, wherein a part of the cup wall closer to a center of the cup bottom has a smaller thickness, and the second space is formed a biscuit shape shrinking toward the cup bottom.

19. The illumination device of claim 15, wherein the phosphor powder layer is formed in a hemispherical shape protruding toward the sealant.

20. The illumination device of claim 15, wherein the phosphor powder layer is formed in a cone shape protruding toward the first space enclosed by the inner circular convex.

21. A manufacture method of an illumination device, comprising:
    forming a base;
    disposing an illumination chip on the base;
    forming a sealant on the base to cover the illumination chip, wherein the sealant has a radial
    cross section passing through the center of the sealant and perpendicular to the base; and forming an inner circular convex and an outer circular convex surrounding the inner circular center convex on an outer surface of the sealant, including:

enabling the inner circular convex enclosing a first space having a narrow bottom and a wide opening; wherein the inner circular convex reflects a part of the light emitted from the illumination chip directly to the outer circular convex and the part of the light leaves the sealant from the outer circular convex;

determining a first radius of curvature of the outer circular convex and a second radius of curvature of the inner circular convex on the same radial cross section of the sealant; wherein the first radius of curvature is different from the second radius of curvature;

enabling a sum of the first radius of curvature and the second radius of curvature to be between a radius and a diameter of the radial cross section; and enabling a ratio of the first radius of curvature to the largest height of the sealant on the radial cross section to be between 0.6 and 1.

22. The manufacture method of claim 21, wherein the step of forming the inner circular convex and the outer circular convex includes: enabling the largest height to be from a boundary of the inner circular convex and the outer circular convex to the base.

23. The manufacture method of claim 21, wherein the step of forming the inner circular convex and the outer circular convex includes: adjusting values of the first radius of curvature and the second radius of curvature inversely.

24. The manufacture method of claim 21, further including: forming a phosphor powder layer covering the illumination chip and enabling the sealant to cover the phosphor powder layer, wherein a thickness of the phosphor powder layer is smaller than 100 μm.

* * * * *